United States Patent
Kwon

(10) Patent No.: US 9,000,436 B2
(45) Date of Patent: Apr. 7, 2015

(54) THIN FILM TRANSISTOR AND ORGANIC LIGHT EMITTING DIODE DISPLAY

(71) Applicant: So-Ra Kwon, Yongin (KR)

(72) Inventor: So-Ra Kwon, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 0 days.

(21) Appl. No.: 13/963,466

(22) Filed: Aug. 9, 2013

(65) Prior Publication Data

US 2014/0299846 A1    Oct. 9, 2014

(30) Foreign Application Priority Data

Apr. 4, 2013  (KR) .................. 10-2013-0036947

(51) Int. Cl.
  *H01L 29/10*   (2006.01)
  *H01L 51/50*   (2006.01)
  *H01L 29/786*  (2006.01)
  *H01L 27/12*   (2006.01)

(52) U.S. Cl.
  CPC .......... *H01L 51/50* (2013.01); *H01L 29/78645* (2013.01); *H01L 27/124* (2013.01)

(58) Field of Classification Search
  CPC . H01L 27/088; H01L 27/124; H01L 27/1214; H01L 27/3262; H01L 29/786; H01L 51/0508
  USPC .......... 257/43, 40, 49, 52, 57, 59, 60, 61, 66, 257/72, 288, 327, 368, E29.15, E29.151, 257/E51.005
  See application file for complete search history.

(56) References Cited

U.S. PATENT DOCUMENTS

| | | | | |
|---|---|---|---|---|
| 6,166,397 A * | 12/2000 | Yamazaki et al. | ............... | 257/59 |
| 6,573,564 B2 * | 6/2003 | Yamazaki et al. | ............ | 257/353 |
| 7,776,712 B2 * | 8/2010 | Yamazaki et al. | ............ | 438/433 |
| 7,808,056 B2 * | 10/2010 | Furuta et al. | .................. | 257/401 |
| 2002/0171086 A1 * | 11/2002 | Miyajima et al. | ............... | 257/72 |
| 2008/0035927 A1 * | 2/2008 | Yamazaki et al. | .................. | 257/59 |
| 2010/0109009 A1 * | 5/2010 | Noda et al. | ................. | 257/59 |
| 2012/0061768 A1 * | 3/2012 | Sasaki et al. | .................. | 257/371 |
| 2012/0087460 A1 * | 4/2012 | Moriwaki | ....................... | 377/64 |
| 2014/0015022 A1 * | 1/2014 | Onda | ........................... | 257/288 |

FOREIGN PATENT DOCUMENTS

| | | |
|---|---|---|
| KR | 10-2001-0014450 A | 2/2001 |
| KR | 10-2011-0103736 A | 9/2011 |

* cited by examiner

*Primary Examiner* — Eduardo A Rodela
(74) *Attorney, Agent, or Firm* — Lee & Morse, P.C.

(57) ABSTRACT

Disclosed is a thin film transistor including an active pattern including a first conductive region, a first channel region adjacent to the first conductive region, a second conductive region spaced apart from the first conductive region, a second channel region spaced apart from the first channel region, and a third conductive region spaced apart from the second conductive region, and a gate electrode positioned on the active pattern and including a first gate region crossing the first channel region, a second gate region crossing the second channel region, and a connection gate region connecting the first gate region. The connection gate region, the first gate region, and the second gate region together surround the second conductive region.

16 Claims, 6 Drawing Sheets

1000

1002

THIN FILM TRANSISTOR AND ORGANIC LIGHT EMITTING DIODE DISPLAY

CROSS-REFERENCE TO RELATED APPLICATION

Korean Patent Application No. 10-2013-0036947, filed on Apr. 4, 2013, in the Korean Intellectual Property Office, and entitled: "Thin Film Transistor and Organic Light Emitting Diode Display," is incorporated by reference herein in its entirety.

BACKGROUND

1. Field

The described technology relates generally to a thin film transistor and an organic light emitting diode display, and more particularly to, a thin film transistor including a plurality of gate electrodes and an organic light emitting diode display including the same.

2. Description of the Related Art

Organic light emitting diode displays have recently been in the spotlight. Organic light emitting diode displays are self-luminescent, not requiring a separate light source, unlike a liquid crystal display (LCD) device, and thus can have reduced thickness and weight. Further, organic light emitting diode displays provide low power consumption, high luminance, and high reaction speed.

Generally, the organic light emitting diode display includes gate wires positioned on a substrate and extending in one direction, data wires extending in a direction crossing the gate wires, a plurality of thin film transistors connected to the gate wires and the data wires, and an organic light emitting device connected to the thin film transistors.

Recently, a plurality of thin film transistors included in the organic light emitting diode display has included one or more thin film transistors including a plurality of gate electrodes for preventing off leakage. However, the thin film transistor including a plurality of gate electrodes has a difference in total switching characteristic due to electric fields generated from the adjacent gate electrodes as compared to a thin film transistor having one gate electrode.

The above information disclosed in this Background section is only for enhancement of understanding of the background of the described technology and therefore it may contain information that does not form the prior art that is already known in this country to a person of ordinary skill in the art

SUMMARY

One or more embodiments provides a thin film transistor including an active pattern and a gate electrode. The active pattern includes a first conductive region, a first channel region, a second conductive region, a second channel region, and a third conductive region. The first channel region is adjacent to the first conductive region. The second conductive region is spaced apart from the first conductive region so that the first channel region is interposed between the first conductive region and the second conductive region. The second channel region is spaced apart from the first channel region so that the second conductive region is interposed between the first channel region and the second channel region. The third conductive region is spaced apart from the second conductive region so that the second channel region is interposed between the second conductive region and the third conductive region. The gate electrode is positioned on the active pattern and includes a first gate region, a second gate region, and a connection gate region. The first gate region crosses the first channel region. The second gate region crosses the second channel region. The connection gate region connects the first gate region and the second gate region and surrounds the second conductive region in conjunction with the first gate region and the second gate region.

The gate electrode may have a closed loop formed of the first gate region, the second gate region, and the connection gate region.

The gate electrode may not overlap with the second conductive region.

The first conductive region, the second conductive region, and the third conductive region may be each formed of a conductive material, and the first channel region and the second channel region may be each formed of a semiconductor material.

The active pattern may include polysilicon, and the gate electrode may include metal.

The first conductive region, the second conductive region, and the third conductive region may be each doped with ions.

The second conductive region may have a shape bent one or more times.

The first conductive region and the first channel region may extend in a first direction, the second channel region and the third second conductive region may extend in a second direction, at an angle to the first direction, and the second conductive region may extend between the first and second channel regions at an angle to the first and second directions.

The first and second directions may be orthogonal.

One or more embodiments provides a thin film transistor including an active pattern and a gate electrode. The active pattern includes three or more conductive regions spaced apart from each other, adjacent conductive regions having a channel region positioned separating them. The gate electrode is positioned on the active pattern and includes a plurality of gate regions and a connection gate region. A plurality of gate regions each crosses a plurality of channel regions. The connection gate region connects a plurality of gate regions.

The gate electrode may have a closed loop formed of a plurality of gate regions and the connection gate region.

The gate electrode may not overlap any of the three or more conductive regions.

Further, one or more embodiments provides an organic light emitting diode display including a substrate, an organic light emitting device, and a thin film transistor. The organic light emitting device is positioned on the substrate. The thin film transistor is connected to the organic light emitting device.

The organic light emitting device may include a first electrode connected to the thin film transistor, an organic light emitting layer positioned on the first electrode, and a second electrode positioned on the organic light emitting layer.

The thin film transistor may supply an initialization power or a data signal to the organic light emitting device.

The organic light emitting diode display may include an additional thin film transistor that supplies a data signal to the organic light emitting device.

BRIEF DESCRIPTION OF THE DRAWINGS

Features will become apparent to those of ordinary skill in the art by describing in detail exemplary embodiments with reference to the attached drawings in which.

DETAILED DESCRIPTION

Figure 1:
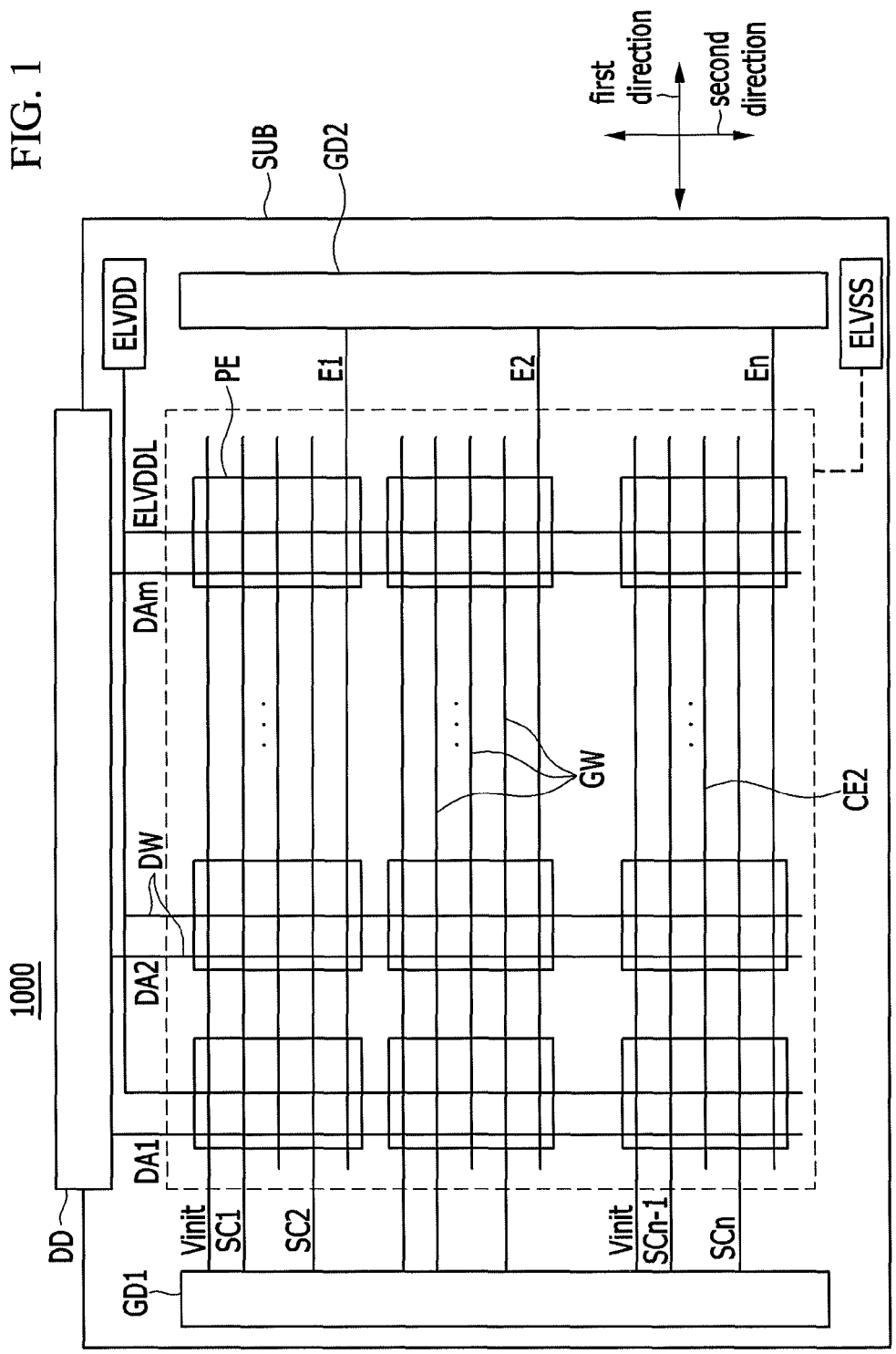
FIG. 1 illustrates a view of an organic light emitting diode display according to a first exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In describing, parts that are not related to the description will be omitted. Like reference numerals generally designate like elements throughout the specification.

In addition, in various exemplary embodiments, the same reference numerals are used in respects to the constituent elements having the same constitution and illustrated in the first exemplary embodiment, and in the other exemplary embodiment, only constitution that is different from the first exemplary embodiment is illustrated.

Furthermore, as the size and thickness of the respective structural components shown in the drawings are arbitrarily illustrated for explanatory convenience, embodiments are not necessarily limited to the illustrated sizes and thicknesses.

In the drawings, the thickness of layers, films, panels, regions, etc., are exaggerated for clarity. In the drawings, for understanding and ease of description, the thicknesses of some layers and areas are exaggerated. It will be understood that when an element such as a layer, film, region, or substrate is referred to as being "on" another element, it can be "directly on" the other element or intervening elements may also be present.

In addition, unless explicitly described to the contrary, the word "comprise" and variations such as "comprises" or "comprising", will be understood to imply the inclusion of stated elements but not the exclusion of any other elements. Further, in the specification, the word "on" means positioning on or below the object portion, but does not essentially mean positioning on the upper side of the object portion based on a gravity direction.

Hereinafter, an organic light emitting diode display according to a first exemplary embodiment is described with reference to FIGS. 1 to 4. Hereinafter, a thin film transistor means a fourth thin film transistor, and a gate electrode means a fourth gate electrode.

FIG. 1 illustrates a view showing an organic light emitting diode display according to a first exemplary embodiment. As shown in FIG. 1, an organic light emitting diode display 1000 according to the first exemplary embodiment includes a gate driver GD1, gate wires GW, a light emission control driver GD2, a data driver DD, data wires DW, and a pixel PE.

The gate driver GD1 may respond to a control signal provided from an external control circuit (not shown), e.g., a timing controller, to sequentially provide scan signals to first scan lines SC1-SCn-1 and second scan lines SC2-SCn included in the gate wires GW. Then, the pixel PE is selected by the scan signals to sequentially receive data signals.

The gate wires GW are positioned on a substrate SUB and extend in a first direction. The gate wires GW include the first scan lines SC1-SCn-1, light emission control lines E1-En, the second scan lines SC2-SCn, initialization power source lines Vinit, and second capacitor electrodes CE2, which will be described below. The first scan lines SC1-SCn-1 are connected to the gate driver GD1 and receives the scan signal from the gate driver GD1. The light emission control lines E1-En are connected to the light emission control driver GD2 and receives a light emission control signal from the light emission control driver GD2. The second scan lines SC2-SCn is connected to the gate driver GD1 and receives the scan signal from the gate driver GD1. The initialization power source lines Vinit are connected to the gate driver GD1 and receives an initialization power source from the gate driver GD1. The second capacitor electrodes CE2 are spaced apart from the first scan line SCn-1 and extend in the first direction.

As described above, the initialization power source lines Vinit, the first scan lines SC1-SCn-1, the second capacitor electrodes CE2, the second scan lines SC2-SCn, and the light emission control lines E1-En are spaced apart from each other and extend in the first direction. The initialization power source lines Vinit, the first scan lines SC1-SCn-1, the second capacitor electrode CE2, the second scan lines SC2-SCn, and the light emission control lines E1-En may be positioned on the same layer to be formed of the same material, and may be formed through a single process, e.g., photolithography.

Alternatively, in another exemplary embodiment, the initialization power source lines Vinit, the first scan lines SC1-SCn-1, the second capacitor electrodes CE2, the second scan lines SC2-SCn, and the light emission control lines E1-En may be positioned on different layers to be formed of different materials.

Further, while the initialization power source line Vinit receives the initialization power source from the gate driver GD1 in accordance with the present embodiment, alternatively, the initialization power source lines Vinit may instead be connected to an additional source to receive an initialization power source from the additional source.

The light emission control driver GD2 responds to the control signal provided from an outside portion, e.g., the timing controller to sequentially provide light emission control signals to the light emission control lines E1-En. Then, light emission of the pixel PE is controlled by the light emission control signal. That is, the light emission control signal controls a light emission time of the pixel PE. However, the light emission control driver GD2 may be omitted according to an internal structure of the pixel PE.

The data driver DD responds to the control signal provided from the outside portion, e.g., the timing controller, to provide the data signal to the data lines DA1-DAm of the data wires DW. The data signal provided to the data lines DA1-DAm is provided to the pixel PE selected by the scan signal whenever the scan signal is provided to the second scan line SCn. Then, the pixel PE charges a voltage corresponding to the data signal, and emits light in brightness corresponding thereto.

The data wires DW may be positioned on the gate wires GW and extend in a second direction crossing the first direction. The data wires DW include the data lines DA1-DAm and a driving power source line ELVDDL. The data lines DA1-DAm are connected to the data driver DD and receive the data signal from the data driver DD. The driving power source line ELVDDL may be connected to an external first power source ELVDD, which will be described below, and receives a driving power source from the first power source ELVDD.

The pixels PE are positioned in an intersection of the gate wires GW and the data wires DW. Each pixel PE may include the organic light emitting device emitting light having a brightness corresponding to a driving current corresponding to the data signal, a plurality of thin film transistors for controlling the driving current flowing through the organic light emitting device, and one or more capacitors. A plurality of thin film transistors and one or more capacitors are each connected to the gate wires GW and the data wires DW, and the organic light emitting device is connected to a plurality of thin film transistors and one or more capacitors. The organic light emitting device is connected between the first power source ELVDD and a second power source ELVSS.

Figure 2:
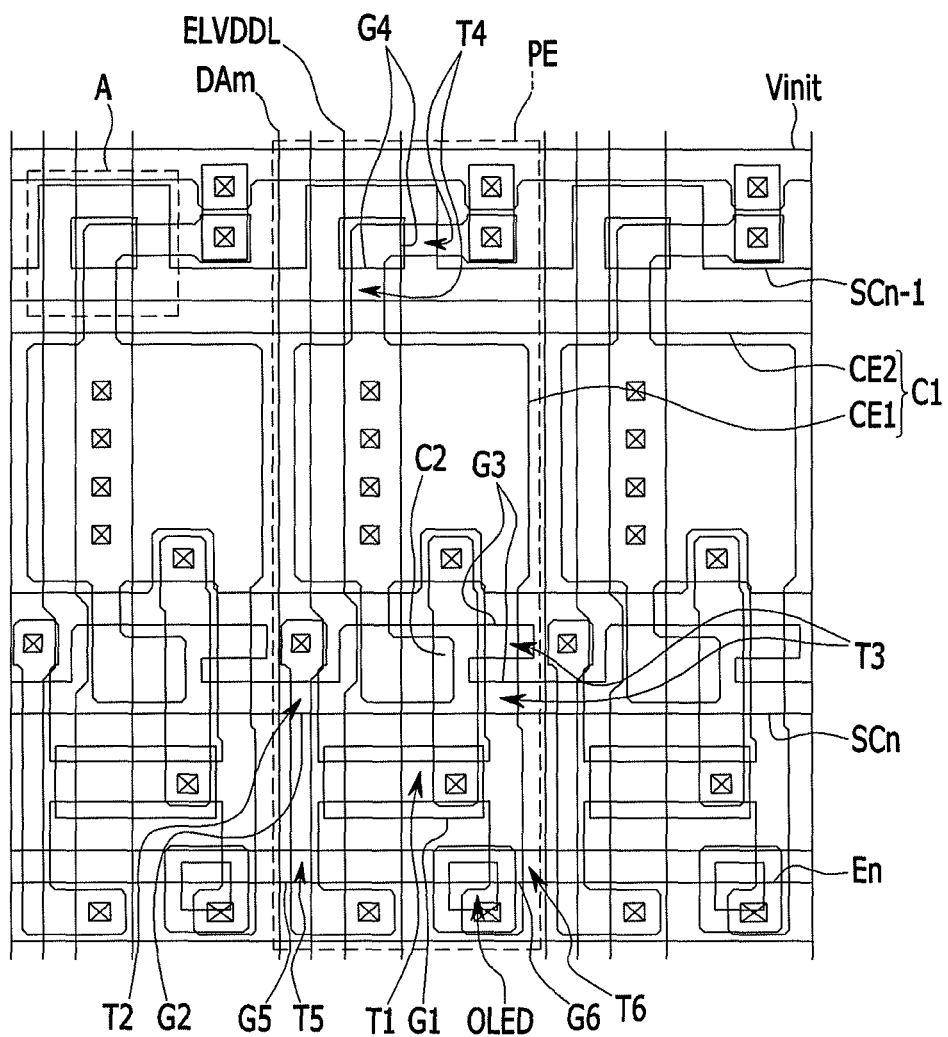
FIG. 2 illustrates a layout view of a pixel portion of FIG. 1.
Figure 3:
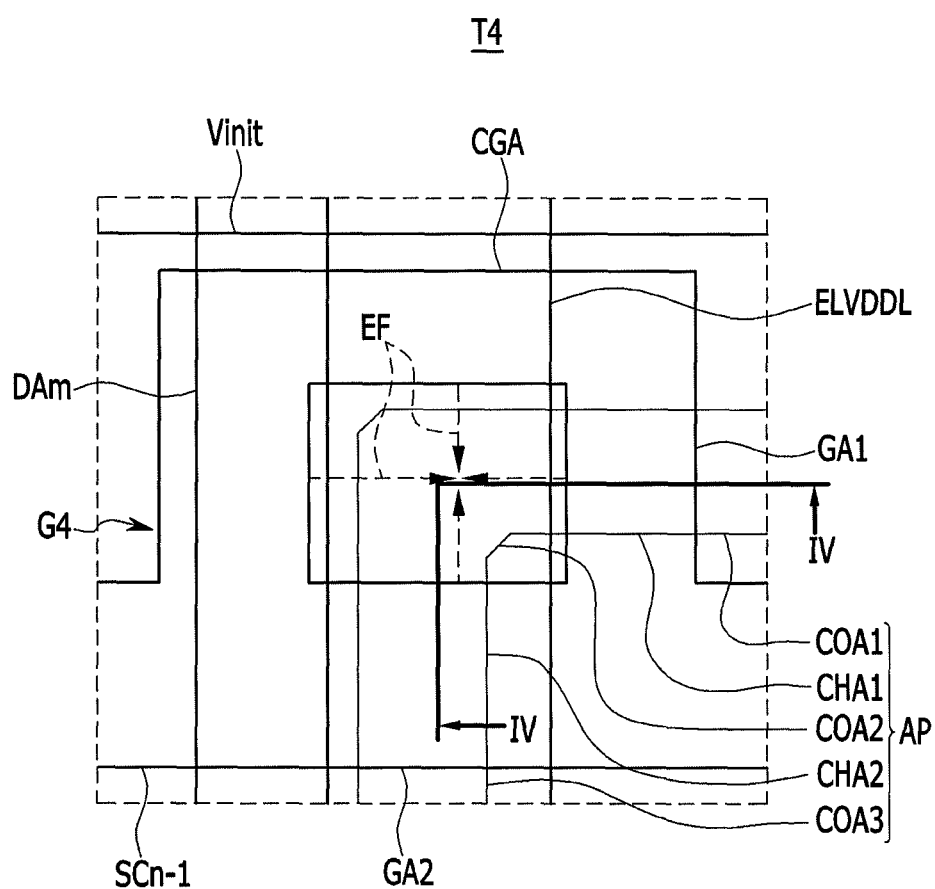
FIG. 3 illustrates an enlarged view of portion A of FIG. 2.
Figure 4:
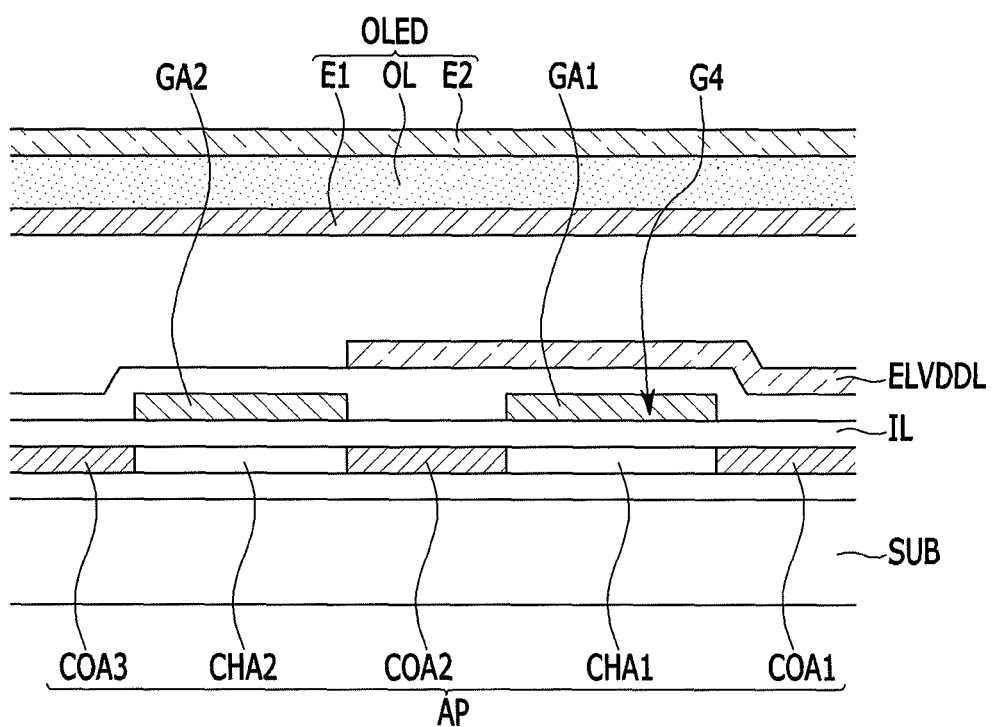
FIG. 4 illustrates a cross-sectional view taken along line IV-IV of FIG. 3.

FIG. 2 illustrates a layout view of a pixel portion of FIG. 1. FIG. 3 is an enlarged view of portion A of FIG. 2. FIG. 4 illustrates a cross-sectional view that is taken along line IV-IV of FIG. 3.

As shown in FIGS. 2 to 4, the pixel PE includes the organic light emitting device OLED connected between the first power source ELVDD and the second power source ELVSS, and a pixel circuit. The pixel circuit may include six thin film transistors connected between the organic light emitting device OLED and the first power source ELVDD to control the driving power source provided to the organic light emitting device OLED, and two capacitors.

The organic light emitting device OLED (shown in FIG. 4) includes a first electrode E1, an organic light emitting layer OL on the first electrode E1, and a second electrode E2 on the organic light emitting layer OL. The first electrode E1 may serve as an anode of the organic light emitting device OLED and is connected to the driving power source line ELVDDL connected through the pixel circuit to the first power source ELVDD. The second electrode E2 may serve as a cathode of the organic light emitting device OLED and is connected to the second power source ELVSS. The organic light emitting layer OL of the organic light emitting device OLED emits light having a brightness corresponding to a driving current flowing through the organic light emitting device OLED when the driving power source is provided from the first power source ELVDD through the pixel circuit and a common power source is provided from the second power source ELVSS.

The pixel circuit may include a first thin film transistor T1, a second thin film transistor T2, a third thin film transistor T3, a fourth thin film transistor T4, a fifth thin film transistor T5, a sixth thin film transistor T6, a first capacitor C1, and a second capacitor C2.

The first thin film transistor T1 is connected between the driving power source line ELVDDL and the first electrode E1 of the organic light emitting device OLED, and provides the driving power source corresponding to the data signal during a light emitting period of the pixel PE from the first power source ELVDD to the organic light emitting device OLED. That is, the first thin film transistor T1 functions as a driving transistor of the pixel PE. A first gate electrode G1 of the first thin film transistor T1 is connected to each of a first capacitor electrode CE1 of the first capacitor C1, the second capacitor C2, the third thin film transistor T3, and the fourth thin film transistor T4. A source electrode of the first thin film transistor T1 is connected to each of the second thin film transistor T2 and the fifth thin film transistor T5. A drain electrode of the first thin film transistor T1 is connected to each of the third thin film transistor T3 and the sixth thin film transistor T6. The first electrode E1 of the organic light emitting device OLED is connected through the sixth thin film transistor T6 to the first thin film transistor T1.

The second thin film transistor T2 connects the data line DAm and the first thin film transistor T1, and includes a second gate electrode G2 connected to the second scan line SCn. The second thin film transistor T2 transfers the data signal provided from the data line DAm into the pixel PE when the scan signal is provided from the second scan line SCn. That is, the second thin film transistor T2 functions as a switching transistor of the pixel PE.

The third thin film transistor T3 connects the first thin film transistor T1 and the first gate electrode G1, and includes a third gate electrode G3 connected to the second scan line SCn. The third thin film transistor T3 is diode-connected to the first thin film transistor T1 when the data signal is provided into the pixel PE, thus compensating a threshold voltage of the first thin film transistor T1. That is, the third thin film transistor T3 functions as a compensation transistor of the pixel PE.

The fourth thin film transistor T4 connects the initialization power source line Vinit and the first gate electrode G1 of the first thin film transistor T1. During an initialization period prior to the data programming period, the fourth thin film transistor T4 transfers the initialization power source provided from the initialization power source line Vinit into the pixel PE to initialize the first thin film transistor T1 so that the data signal is smoothly provided to the pixel PE during a data programming period during which the data signal is input to the pixel PE when the scan signal is provided from the first scan line SCn-1. That is, the fourth thin film transistor T4 functions as a switching transistor of the pixel PE. The fourth thin film transistor T4 includes an active pattern AP and a fourth gate electrode G4.

The active pattern AP connects the initialization power source line Vinit and the first gate electrode G1 of the first thin film transistor T1. Specifically, the active pattern AP connects the initialization power source line Vinit and the first capacitor electrode CE1 of the first capacitor C1. The active pattern AP may include a first conductive region COA1, a first channel region CHA1, a second conductive region COA2, a second channel region CHA2, and a third conductive region COA3 sequentially extending in a predetermined direction.

The first conductive region COA1 connects the initialization power source line Vinit and the first channel region CHA1, and is formed of a conductive material. For example, the first conductive region COA1 may include, e.g., polysilicon doped with ions to have characteristics of a conductor.

The first channel region CHA1 is adjacent to the first conductive region COA1 to connect the first conductive region COA1 and the second conductive region COA2, and is a semiconductor. For example, the first channel region CHA1 may include, e.g., polysilicon that is a semiconductor material.

The second conductive region COA2 is spaced apart from the first conductive region COA1 with the first channel region CHA1 interposed therebetween to connect the first channel region CHA1 and the second channel region CHA2, and is formed of a conductive material. For example, the second conductive region COA2 may include polysilicon doped with ions to have characteristics of a conductor. The second conductive region COA2 may have a shape that is bent once, and extends from the first channel region CHA1 to the second channel region CHA2.

For example, as illustrated in FIG. 3, the first conductive region COA1 and the first channel region CHA1 may extend in a particular direction, e.g., the first direction, while the second channel region CHA2 and the third conductive region COA3 may extend in a different particular direction, e.g., the second direction, at an angle, e.g., orthogonal to, the particular direction. The second conductive region COA2 may extend between and connect the first channel region CHA1 and the second channel region CHA2. Thus, the second conductive region COA2 may be at an angle to the particular direction, e.g., the first and second directions.

Alternatively, in another exemplary embodiment, the second conductive region COA2 may correspond to a design of a whole pixel PE to have a shape bent two or more times.

The second channel region CHA2 is spaced apart from the first channel region CHA1 with the second conductive region COA2 interposed therebetween to connect the second conductive region COA2 and the third conductive region COA3, and is a semiconductor material. For example, the second channel region CHA2 may include, e.g., polysilicon that is a semiconductor material having characteristics of a semiconductor.

The third conductive region COA3 is spaced apart from the second conductive region COA2 with the second channel region CHA2 interposed therebetween to connect the second channel region CHA2 and the first capacitor electrode CE1 of the first capacitor C1, and is a conductive material. For example, the conductive region COA3 may include, e.g., polysilicon doped with ions to have characteristics of a conductor.

The fourth gate electrode G4 is positioned on the active pattern AP with an insulation layer IL interposed therebetween. The fourth gate electrode G4 is connected to the first scan line SCn-1 and does not overlap the second conductive region COA2 of the active pattern AP. The fourth gate electrode G4 may include a first gate region GA1, a second gate region GA2, and a connection gate region CGA including a conductive material, e.g., a metal.

The first gate region GA1 is on the first channel region CHA1 and crosses the first channel region CHA1 in the second direction. The second gate region GA2 is spaced apart from the first gate region GA1, is on the second channel region CHA2, and crosses the second channel region CHA2 in the first direction.

The connection gate region CGA connects the first gate region GA1 and the second gate region GA2, and, in conjunction with the first gate region GA1 and the second gate region GA2, surrounds the second conductive region COA2. The connection gate region CGA connects an end of the first gate region GA1 and an end of the second gate region GA2, and does not overlap the second conductive region COA2.

In other words, the fourth gate electrode G4 does not overlap the second conductive region COA2, and has a closed loop formed of the first gate region GA1, the second gate region GA2, and the connection gate region CGA.

Thus, even though electric fields EF generated from the first gate region GA1 and the second gate region GA2 adjacent to each other affect the second conductive region COA2, since an electric field EF generated from the connection gate region CGA offsets the electric fields EF generated from the first gate region GA1 and the second gate region GA2 affecting the second conductive region COA2, the fourth thin film transistor T4 suppresses or reduces a difference in total switching characteristic as compared to each of the second thin film transistor T2, the fifth thin film transistor T5, and the sixth thin film transistor T6 that are switching transistors having one gate electrode.

The fifth thin film transistor T5 connects the driving power source line ELVDDL and the first thin film transistor T1, and includes a fifth gate electrode G5 connected to the light emission control line En. During a non-light emitting period of the pixel PE, the fifth thin film transistor T5 blocks connection between the driving power source line ELVDDL connected to the first power source ELVDD and the first thin film transistor T1. During a light emitting period of the pixel PE, the fifth thin film transistor T5 connects the driving power source line ELVDDL and the first thin film transistor T1. Thus, the fifth thin film transistor T5 functions as a switching transistor of the pixel PE.

The sixth thin film transistor T6 connects the first thin film transistor T1 and the first electrode E1 of the organic light emitting device OLED, and includes a sixth gate electrode G6 connected to the light emission control line En. During the non-light emitting period of the pixel PE, the sixth thin film transistor T6 blocks connection between the first thin film transistor T1 and the organic light emitting device OLED. During the light emitting period of the pixel PE, the sixth thin film transistor T6 connects the first thin film transistor T1 and the organic light emitting device OLED. That is, the sixth thin film transistor T6 functions as a switching transistor of the pixel PE.

The first gate electrode G1, the second gate electrode G2, the third gate electrode G3, the fourth gate electrode G4, the fifth gate electrode G5, and the sixth gate electrode G6 may positioned on the same layer, and may be formed at the same time as the gate wires GW using a single process of forming the gate wires GW, e.g., photolithography.

The first capacitor C1 for storing the data signal provided into the pixel PE during the data programming period and maintaining the data signal during one frame may be formed between the driving power source line ELVDDL connected to the first power source ELVDD and the first gate electrode 01 of the first thin film transistor T1 connected to the initialization power source line Vinit. That is, the first capacitor C1 functions as a storage capacitor.

The first capacitor C1 includes the first capacitor electrode CE1 and the second capacitor electrode CE2 positioned on the substrate SUB and facing each other with a first insulation layer interposed therebetween. The first capacitor electrode CE1 may be connected through the fourth thin film transistor T4 to the initialization power source line Vinit and may be positioned on the same layer as the active pattern AP. The second capacitor electrode CE2 is connected to the driving power source line ELVDDL and may be positioned on the same layer as the gate wires GW. The second capacitor electrode CE2, as shown in FIG. 1, crosses adjacent pixels PE and extends in the first direction.

The second capacitor C2 for compensating a voltage drop due to a load in the organic light emitting diode display 1000 may be formed between the first capacitor electrode CE1 of the first capacitor C1 and the second scan line SCn. That is, when a voltage level of a current scan signal is changed, and particularly, when provision of the current scan signal is stopped, the second capacitor C2 increases a voltage of the first gate electrode G1 of the first thin film transistor T1 due to a coupling function to function as a boosting capacitor compensating a voltage drop due to a load in the organic light emitting diode display 1000.

Hereinafter, operation of the pixel PE is described.

First, a prior scan signal at a low level is provided through the first scan line SCn-1 during a first period that serves as an initialization period. Then, the fourth thin film transistor T4 responds to the prior scan signal at the low level to be turned-on, and the initialization power source is provided from the initialization power source line Vinit through the fourth thin film transistor T4 to the first thin film transistor T1 to initialize the first thin film transistor T1.

Thereafter, the current scan signal at a low level is provided through the second scan line SCn during a second period that serves as the data programming period. Then, the second thin film transistor T2 and the third thin film transistor T3 respond to the current scan signal at a low level to be turned-on.

In addition, the first thin film transistor T1 is turned-on in a diode-connection form by the third thin film transistor T3. In particular, since the first thin film transistor T1 is initialized during the first period, the first thin film transistor T1 is diode-connected in a forward direction.

Thereby, the data signal provided from the data line DAm is provided through the second thin film transistor T2, the first thin film transistor T1, and the third thin film transistor T3, accordingly, a voltage corresponding to a difference between the data signal and the threshold voltage of the first thin film transistor T1 is stored in the first capacitor C1.

Thereafter, if the voltage level of the current scan signal is changed to a high level while provision of the current scan signal is stopped, the voltage applied to the first gate electrode G1 of the first thin film transistor T1 is changed corresponding to a voltage change width of the current scan signal due to a coupling action of the second capacitor C1. Since the voltage applied to the first gate electrode G1 of the first thin film transistor T1 is changed due to charge sharing between the first capacitor C1 and the second capacitor C2, a change quantity of voltage applied to the first gate electrode G1 is changed in proportional to a charge sharing value between the first capacitor C1 and the second capacitor C2 in conjunction with a change width of voltage of the current scan signal.

Thereafter, a light emission control signal provided from the light emission control line En during a third period that is set as the light emitting period is changed from the high level to the low level. Then, the fifth thin film transistor T5 and the sixth thin film transistor T6 are turned-on by the light emission control signal at the low level during the third period. Thereby, a driving current is provided through a path ranging from the first power source ELVDD through the driving power source line ELVDDL via the fifth thin film transistor T5, the first thin film transistor T1, the sixth thin film transistor T6, and the organic light emitting device OLED to the second power source ELVSS.

The driving current is controlled by the first thin film transistor T1, and the first thin film transistor T1 generates a driving current having the magnitude corresponding to the voltage provided to the first gate electrode G1 thereof. Since a voltage reflecting the threshold voltage of the first thin film transistor T1 is stored in the first capacitor C1 during the second period, the threshold voltage of the first transistor T1 is compensated during the third period.

As described above, since the second conductive region COA2 of the fourth thin film transistor T4 having the dual gate regions is not affected by the electric fields EF generated from the first gate region GA1 and the second gate region GA2 adjacent to each other, the organic light emitting diode display 1000 according to the first exemplary embodiment suppresses an unintended change of a set value of the initialization power source provided from the initialization power source line Vinit through the fourth thin film transistor T4 to the first thin film transistor T1. This aids to improve total luminous efficiency of the organic light emitting diode display 1000.

As pixel number per inch (ppi) and area of the organic light emitting diode display increases, changes in initialization power source flowing through the whole organic light emitting diode display are of concern. However, the organic light emitting diode display 1000 according to the first exemplary embodiment suppresses the unintended changes of the set value of the initialization power source provided from the initialization power source line Vinit through the fourth thin film transistor T4 to the first thin film transistor T1, thus improving total luminous efficiency. That is, the organic light emitting diode display 1000 has both a high resolution and an improved display quality.

Hereinafter, an organic light emitting diode display according to a second exemplary embodiment is described with reference to FIG. 5. Hereinafter, a thin film transistor means a fourth thin film transistor and a third thin film transistor, and a gate electrode means a fourth gate electrode and a third gate electrode.

Hereinafter, only specific portions that are different from those of the first exemplary embodiment are extracted to be described, and an omitted portion of description thereof conforms to the first exemplary embodiment. In addition, in the second exemplary embodiment, for better comprehension and ease of description, the same constituent elements are designated by the same reference numerals as the first exemplary embodiment.

Figure 5:
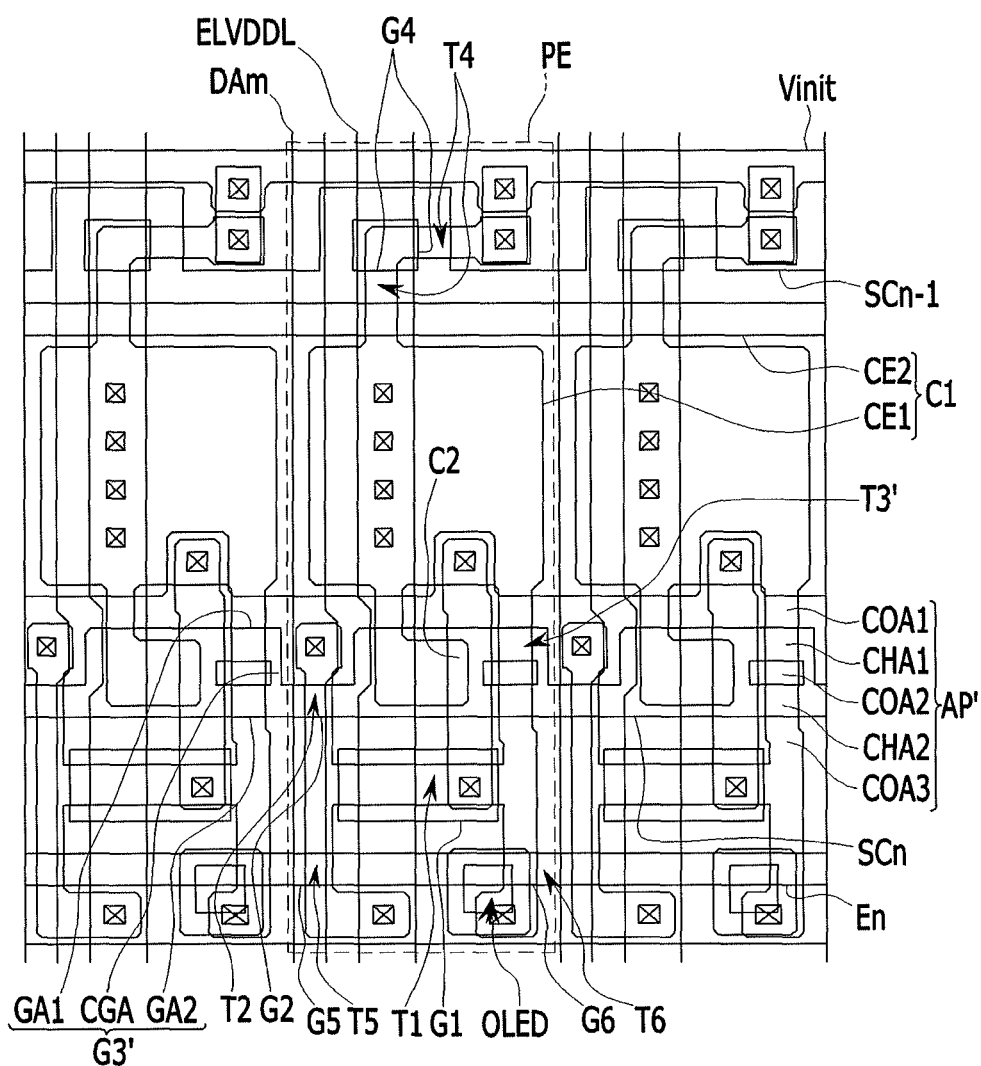
FIG. 5 illustrates a layout view of a pixel of an organic light emitting diode display according to a second exemplary embodiment.

FIG. 5 illustrates a layout view showing a pixel of the organic light emitting diode display according to the second exemplary embodiment.

As shown in FIG. 5, a third thin film transistor T3' of an organic light emitting diode display 1002 according to the second exemplary embodiment connects the first thin film transistor T1 and the first gate electrode G1. The third thin film transistor T3' is diode-connected to the first thin film transistor T1 when a data signal is provided into a pixel PE, thus compensating a threshold voltage of the first thin film transistor T1. That is, the third thin film transistor T3' functions as a compensation transistor of the pixel PE. The third thin film transistor T3' may include an active pattern AP', e.g., that may have the same structure the active pattern AP associated with the transistor T4, and a third gate electrode G3'.

The active pattern AP' connects the first gate electrode G1 and the first thin film transistor T1. Specifically, the active pattern AP' connects the first capacitor electrode CE1 of the first capacitor C1 and an active layer of the first thin film transistor T1.

The active pattern AP' includes a first conductive region COA1, a first channel region CHA1, a second conductive region COA2, a second channel region CHA2, and a third conductive region COA3 sequentially extending in a predetermined direction.

The first conductive region COA1 connects the initialization power source line Vinit and the first channel region CHA1, and is formed of a conductive material. For example, the first conductive region COA1 may include, e.g., polysilicon doped with ions to have characteristics of a conductor.

The first channel region CHA1 is adjacent to the first conductive region COA1 to connect the first conductive region COA1 and the second conductive region COA2, and is a semiconductor. For example, the first channel region CHA1 may include, e.g., polysilicon that is a semiconductor material.

The second conductive region COA2 is spaced apart from the first conductive region COA1 with the first channel region CHA1 interposed therebetween to connect the first channel region CHA1 and the second channel region CHA2, and is formed of a conductive material. For example, the second conductive region COA2 may include polysilicon doped with ions to have characteristics of a conductor. The second conductive region COA2 may have a shape that is bent once, and extends from the first channel region CHA1 to the second channel region CHA2.

The second channel region CHA2 is spaced apart from the first channel region CHA1 with the second conductive region COA2 interposed therebetween to connect the second conductive region COA2 and the third conductive region COA3, and is a semiconductor material. For example, the second channel region CHA2 may include, e.g., polysilicon that is a semiconductor material having characteristics of a semiconductor.

The third conductive region COA3 is spaced apart from the second conductive region COA2 with the second channel region CHA2 interposed therebetween to connect the second channel region CHA2 and the first capacitor electrode CE1 of the first capacitor C1, and is a conductive material. For example, the conductive region COA3 may include, e.g., polysilicon doped with ions to have characteristics of a conductor.

The third gate electrode G3' is positioned on the active pattern AP'.

The third gate electrode G3' is connected to the second scan line SCn and does not overlap the second conductive region COA2 of the active pattern AP'. The third gate electrode G3' may include a first gate region GA1, a second gate region GA2, and a connection gate region CGA including a conductive material, e.g., metal, and may have a same configuration as the third electrode G3 associated with the fourth transistor T4.

The first gate region GA1 is positioned on the first channel region CHA1 to cross the first channel region CHA1 in the first direction. The second gate region GA2 is spaced apart from the first gate region GA1, is positioned on the second channel region CHA2, and crosses the second channel region CHA2 in the second direction.

The connection gate region CGA connects the first gate region GA1 and the second gate region GA2, and surrounds the second conductive region COA2 in conjunction with the first gate region GA1 and the second gate region GA2. The connection gate region CGA connects an end of the first gate region GA1 and an end of the second gate region GA2, and does not overlap the second conductive region COA2.

That is, the third gate electrode G3 does not overlap with the second conductive region COA2, and has a closed loop formed of the first gate region GA1, the second gate region GA2, and the connection gate region CGA.

Even though electric fields generated from the first gate region GA1 and the second gate region GA2 adjacent to each other affects the second conductive region COA2, since an electric field generated from the connection gate region CGA offsets the electric fields generated from the first gate region GA1 and the second gate region GA2 affecting the second conductive region COA2, the third thin film transistor T3 suppresses an occurrence of a difference in total switching characteristic as compared to each of the second thin film transistor T2, the fifth thin film transistor T5, and the sixth thin film transistor T6 that are switching transistors having one gate electrode.

As described above, since the second conductive region COA2 of each of the third thin film transistor T3' and the fourth thin film transistor T4 having the dual gate regions is not affected by the electric fields generated from the first gate region GA1 and the second gate region GA2 adjacent to each other, the organic light emitting diode display 1002 according to the second exemplary embodiment suppresses an unintended change of a set value of each of an initialization power source provided from an initialization power source line Vinit through a fourth thin film transistor T4 to the first thin film transistor T1 and a data signal provided from the second scan line SCn through the third thin film transistor T3. This aids in improving total luminous efficiency of the organic light emitting diode display 1002.

As pixel number per inch (ppi) and area of the organic light emitting diode display increases, changes in initialization power source and data signal flowing through the whole organic light emitting diode display, are of concern. However, the organic light emitting diode display 1002 according to the second exemplary embodiment suppresses the unintended change of the set value of each of the initialization power source provided from the initialization power source line Vinit through the fourth thin film transistor T4 to the first thin film transistor T1 and the data signal provided from the second scan line SCn through the third thin film transistor T3', improving total luminous efficiency. Thus, the organic light emitting diode display 1002 has both a high resolution and an improved display quality.

Figure 6:
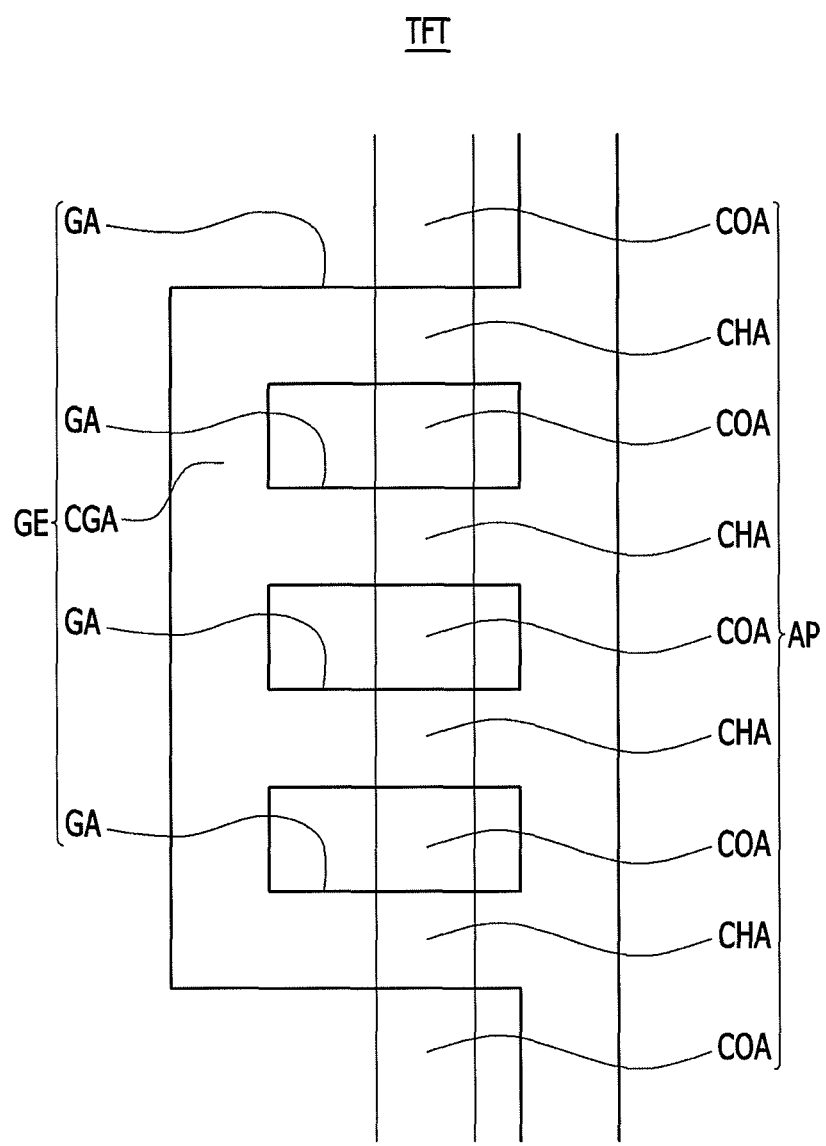
FIG. 6 illustrates a view of a thin film transistor according to a third exemplary embodiment.

Hereinafter, a thin film transistor according to a third exemplary embodiment is described with reference to FIG. 6. FIG. 6 illustrates a view of the thin film transistor according to the third exemplary embodiment.

As shown in FIG. 6, a thin film transistor TFT according to the third exemplary embodiment includes an active pattern AP and a gate electrode GE.

The active pattern AP includes five conductive regions COA corresponding to three or more conductive regions and spaced apart from each other, and four channel regions CHA corresponding to a plurality of channel regions and positioned between all of the five conductive regions COA.

The gate electrode GE is positioned on the active pattern AP, and includes four gate regions GA each crossing the four channel regions CHA and corresponding to a plurality of gate regions and a connection gate region CGA connecting ends of the four gate regions GA.

The gate electrode GE has a closed loop formed of the four gate regions GA and the connection gate region CGA.

Even though an electric field generated from each of the four adjacent gate regions GA affects the conductive region COA disposed between the adjacent channel regions CHA, since an electric field generated from the connection gate region CGA offsets an electric field generated from each of the four gate regions GA affecting the conductive region COA disposed between the adjacent channel regions CHA, the thin film transistor TFT according to the third exemplary embodiment suppresses an occurrence of a difference in total switching characteristic as compared to a thin film transistor having one gate electrode.

As described above, since the conductive region COA disposed between the adjacent channel regions CHA is not affected by the electric field generated from each of the four adjacent gate regions GA, the thin film transistor TFT according to the third exemplary embodiment suppresses an unintended change of a set value of a current flowing from the conductive region COA positioned at the uppermost end to the conductive region COA positioned at the lowermost end in FIG. 6. This aids in suppressing a difference in total switching characteristic of the thin film transistor. That is, the thin film transistor suppressing a difference in switching characteristics is provided.

By way of summation and review, according to embodiments, by providing a gate electrode that is a closed loop of at least two gate regions of one or more transistors, electric fields generated may be contained, suppressing changes in current flowing therethrough and maintaining switching characteristics thereof.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A thin film transistor, comprising:
    an active pattern including a first conductive region, a first channel region adjacent to the first conductive region, a second conductive region spaced apart from the first conductive region so that the first channel region is interposed between and directly connects the first conductive region and the second conductive region, a second channel region spaced apart from the first channel region so that the second conductive region is interposed between the first channel region and the second channel region, and a third conductive region spaced apart from the second conductive region so that the second channel region is interposed between and directly connects the second conductive region and the third conductive region; and
    a gate electrode positioned on the active pattern and including a first gate region crossing the first channel region, a second gate region crossing the second channel region, and a connection gate region connecting the first gate region and the second gate region, wherein the connection gate region, the first gate region, and the second gate region together surround the second conductive region,
    wherein the gate electrode has a closed loop formed of the first gate region, the second gate region, and the connection gate region.

2. The thin film transistor as claimed in claim 1, wherein the gate electrode does not overlap the second conductive region.

3. The thin film transistor as claimed in claim 1, wherein:
    the first conductive region, the second conductive region, and the third conductive region are each formed of a conductive material, and
    the first channel region and the second channel region are each formed of a semiconductor material.

4. The thin film transistor as claimed in claim 3, wherein:
    the active pattern includes polysilicon, and
    the gate electrode includes metal.

5. The thin film transistor as claimed in claim 4, wherein the first conductive region, the second conductive region, and the third conductive region are each doped with ions.

6. The thin film transistor as claimed in claim 1, wherein the first conductive region and the first channel region extend in a first direction, the second channel region and the third second conductive region extend in a second direction, at an angle to the first direction, and the second conductive region extends between the first and second channel regions at an angle to the first and second directions.

7. The thin film transistor as claimed in claim 6, wherein the first and second directions are orthogonal.

8. The thin film transistor as claimed in claim 1, wherein the second channel region includes at least one bend.

9. An organic light emitting diode display, comprising:
    a substrate;
    an organic light emitting device on the substrate; and
    the thin film transistor as claimed in claim 1, the thin film transistor being connected to the organic light emitting device.

10. The organic light emitting diode display as claimed in claim 9, wherein the organic light emitting device includes:
    a first electrode connected to the thin film transistor;
    an organic light emitting layer positioned on the first electrode; and
    a second electrode positioned on the organic light emitting layer.

11. The organic light emitting diode display as claimed in claim 9, wherein the thin film transistor supplies an initialization power to the organic light emitting device.

12. The organic light emitting diode display as claimed in claim 11, further comprising an additional thin film transistor, wherein the additional thin film transistor supplies a data signal to the organic light emitting device.

13. The organic light emitting diode display as claimed in claim 9, wherein the thin film transistor supplies a data signal to the organic light emitting device.

14. A thin film transistor, comprising:
    an active pattern including three or more conductive regions spaced apart from each other, adjacent conductive regions having a channel region separating and directly connecting them; and
    a gate electrode on the active pattern, the gate electrode including a plurality of gate regions each crossing the plurality of channel regions and a connection gate region connecting the plurality of gate regions,
    wherein the gate electrode has a closed loop formed of the plurality of gate regions and the connection gate region.

15. The thin film transistor as claimed in claim 14, wherein the gate electrode does not overlap any of the three or more conductive regions.

16. A thin film transistor, comprising:
    an active pattern including three or more conductive regions spaced apart from each other, adjacent conductive regions having a channel region separating them; and
    a gate electrode on the active pattern, the gate electrode including a plurality of gate regions each crossing the plurality of channel regions and a connection gate region connecting the plurality of gate regions,
    wherein the gate electrode has a closed loop formed of the plurality of gate regions and the connection gate region.

* * * * *